United States Patent
Katayama et al.

(10) Patent No.: US 10,096,347 B2
(45) Date of Patent: Oct. 9, 2018

(54) BATTERY PACK AND METHOD FOR WRITING DATA TO BATTERY PACK

(71) Applicant: MAKITA CORPORATION, Anjo-shi, Aichi (JP)

(72) Inventors: Junichi Katayama, Anjo (JP); Tomoo Muramatsu, Anjo (JP)

(73) Assignee: MAKITA CORPORATION, Anjo-shi (JP)

( * ) Notice: Subject to any disclaimer, the term of this patent is extended or adjusted under 35 U.S.C. 154(b) by 0 days.

(21) Appl. No.: 15/792,321

(22) Filed: Oct. 24, 2017

(65) Prior Publication Data
US 2018/0114554 A1    Apr. 26, 2018

(30) Foreign Application Priority Data

Oct. 26, 2016 (JP) .................. 2016-209222

(51) Int. Cl.
| | |
|---|---|
| *G11C 7/00* | (2006.01) |
| *G11C 7/10* | (2006.01) |
| *G11C 5/14* | (2006.01) |
| *H01M 10/42* | (2006.01) |
| *H02J 7/00* | (2006.01) |

(52) U.S. Cl.
CPC ............ *G11C 7/1096* (2013.01); *G11C 5/141* (2013.01); *H01M 10/425* (2013.01); *H02J 7/00* (2013.01); *H01M 2010/4278* (2013.01); *H01M 2220/30* (2013.01); *H02J 7/0073* (2013.01); *H02J 2007/0096* (2013.01); *H02J 2007/0098* (2013.01)

(58) Field of Classification Search
CPC ....... G11C 7/1078; G11C 7/22; G11C 7/1072; G11C 7/1051; G11C 7/1096

USPC .............. 365/189.16, 189.14, 195
See application file for complete search history.

(56) References Cited

U.S. PATENT DOCUMENTS

| | | | |
|---|---|---|---|
| 2008/0123409 A1* | 5/2008 | Shirakawa | G11C 11/5628 365/185.03 |
| 2010/0019719 A1 | 1/2010 | Okabayashi | |
| 2016/0118821 A1 | 4/2016 | Takeda et al. | |

FOREIGN PATENT DOCUMENTS

| | | |
|---|---|---|
| EP | 2 148 405 A2 | 1/2010 |
| JP | 3842076 B2 | 11/2006 |

OTHER PUBLICATIONS

Mar. 16, 2018 Extended European Search Report issued in European Patent Application No. 17198357.0.

(Continued)

*Primary Examiner* — Son Dinh
(74) *Attorney, Agent, or Firm* — Oliff PLC (57) ABSTRACT

A battery pack in one aspect of the present disclosure includes a rechargeable battery, a rewritable nonvolatile memory, a write request receiver, and a write controller. The rewritable nonvolatile memory includes storage areas including a write-inhibit area. The write request receiver receives a write request and data from a charger. The write request includes a first address assigned to a first storage area of the storage areas. The data includes a first data element. The write controller executes a write process for the received data. The write process includes avoiding writing the first data element to the first storage area in response to determining that the first storage area is the write-inhibit area.

16 Claims, 7 Drawing Sheets

(56) References Cited

OTHER PUBLICATIONS

Cvetkovic, J. et al., "Universal Battery Management System in a Handheld Device", Electrotechnical Conference (Melecon), 2012 16th IEEE Mediterranean, IEEE, Mar. 25, 2012 (Mar. 25, 2012), pp. 975-978, XP032179861.

Anonymous: "SBS v1.1—Compliant Gas Gauge IC (bq206A)", Texas Instrument Incorporated, Oct. 2010 (Oct. 2010), pp. 1-54, 7PP, XP002778359.

* cited by examiner

FIG. 7

BATTERY PACK AND METHOD FOR WRITING DATA TO BATTERY PACK

CROSS-REFERENCE TO RELATED APPLICATIONS

The subject application claims the benefit of Japanese Patent Application No. 2016-209222 filed on Oct. 26, 2016 with the Japan Patent Office, and the entire disclosure of Japanese Patent Application No. 2016-209222 is incorporated herein by reference.

BACKGROUND

The present disclosure relates to a battery pack including a rechargeable battery.

A charger disclosed in Japanese Patent No. 3842076 is configured to write a charge history of a battery in a battery pack to an EEPROM in the battery pack during charging.

SUMMARY

The above-described charger may involve the following problems.

That is, an improper write request may be sent to the battery pack due to improper operation in a charger or disturbance caused by noise, etc. In this case, such data that has been written in response to the improper write request may cause the battery pack not to operate properly. Specifically, for example, the battery may not be properly charged by the charger.

It is desirable in one aspect of the present disclosure to provide a technique for inhibiting improper writing of data to a rewritable nonvolatile memory in a battery pack.

A battery pack in one aspect of the present disclosure includes a rechargeable battery, a rewritable nonvolatile memory, a write request receiver, and a write controller. The rewritable nonvolatile memory includes storage areas. The storage areas include a write-inhibit area. Each of the storage areas is assigned a respective unique individual address.

The write request receiver receives a write request and data that are transmitted from a charger electrically coupled to the battery pack. The write request includes a first address assigned to a first storage area of the storage areas. The data includes a first data element.

The write controller executes a write process for the received data. The write process includes: determining whether the first storage area is the write-inhibit area based on the first address included in the received write request; writing the first data element included in the received data to the first storage area in response to determining that the first storage area is not the write-inhibit area; and avoiding writing the first data element to the first storage area in response to determining that the first storage area is the write-inhibit area.

In the battery pack configured as described above, the write controller writes, or avoids writing, the first data element to the first storage area in response to determining whether the first storage area is the write-inhibit area. Thus, improper writing of data to the rewritable nonvolatile memory can be inhibited.

The battery pack may further include a completion-notifying transmitter. The completion-notifying transmitter transmits a write-completion notice to the charger in response to completion of the write process.

In this case, regardless of whether the first storage area is the write-inhibit area, the write-completion notice is transmitted in response to completion of the write process. Thus, the charger can confirm that the battery pack operates properly and therefore, can charge the battery properly.

The write process may further include: determining whether the first data element is proper; and avoiding writing the first data element to the first storage area in response to determining that the first data element is not proper.

In the battery pack configured as described above, in addition to that the first data element will not be written to the write-inhibit area, and also, the first data element that is not proper will not be written to the first storage area. Thus, it can be further ensured that improper writing of the data to the rewritable nonvolatile memory is inhibited.

The received data may further include a second data element. In this case, the write process may further include: determining whether a second storage area of the storage areas is the write-inhibit area based on a second address assigned to the second storage area; writing the second data element to the second storage area in response to determining that the second storage area is not the write-inhibit area; and avoiding writing the second data element to the second storage area in response to determining that the second storage area is the write-inhibit area.

The write process may further include: determining whether the second data element is proper; and avoiding writing the second data element to the second storage area in response to determining that the second data element is not proper.

The first storage area may correspond to a storage area to which the received data is first written.

The write process may further include: writing the first data element and the second data element to the first storage area and the second storage area respectively based on the first address and the second address included in the received write request; determining whether the second storage area is the write-inhibit area based on the second address included in the received write request; and avoiding writing the second data element to the second storage area in response to determining that the second storage area is the write-inhibit area.

The write process may further include: determining whether the second data element is proper; and avoiding writing the second data element to the second storage area in response to determining that the second data element is not proper.

The battery pack may further include a read request receiver and a read controller. The read request receiver receives a read request transmitted from the charger. The read request includes a third address assigned to a third storage area of the storage areas. The read controller reads a data element that is stored in the third storage area based on the third address included in the received read request so as to transmit the read data element to the charger.

The third storage area to which the third address is assigned may correspond to the write-inhibit area.

That is to say, in the battery pack configured as described above, when the firs storage area corresponding to the first address included in the write request is the write-inhibit area, the first data element is not written to the first storage area. However, even if the third storage area corresponding to the third address included in the read request is the write-inhibit area, the data element stored in the third storage area is read and transmitted to the charger.

For this reason, the charger transmits the read request including the third address assigned to the third storage area corresponding to the write-inhibit area, thereby acquiring the data element stored in the write-inhibit area. The charger confirms the acquired data element, thereby determining whether the battery pack operates properly. Moreover, the charger may, for example, deliberately request writing of a data element to the write-inhibit area and thereafter, acquire and confirm a data element stored in the write-inhibit area. By this configuration, the charger can determine whether the battery pack operates properly. The third storage area may be the same storage area as one of the first storage area and the second storage area, or may be a different storage area than the first storage area and the second storage area.

The battery pack may be configured to be attachable to and detachable from an electric working machine.

The rewritable nonvolatile memory may include, for example, a flash memory and/or an EEPROM.

The battery pack may further include the charger configured to be electrically coupled to the battery pack. The charger may include: a charging circuit configured to charge the battery in the battery pack electrically coupled to the charger; and a write request transmitter configured to transmit the write request and the data to the battery pack electrically coupled to the charger.

The write request transmitted from the write request transmitter may include an address assigned to the write-inhibit area.

A battery pack in another aspect of the present disclosure includes a processor and a memory circuit. The memory circuit includes a rewritable nonvolatile memory. The rewritable nonvolatile memory includes storage areas. The storage areas include a write-inhibit area. Each of the storage areas is assigned a respective unique individual address. The memory circuit includes instructions that makes the processor perform at least the following: receiving a write request and data from a charger electrically coupled to the battery pack, the write request including a first address assigned to a first storage area of the storage areas, the data including a first data element; determining whether the first storage area is the write-inhibit area based on the first address included in the received write request; writing the first data element included in the received data to the first storage area in response to determining that the first storage area is not the write-inhibit area; and avoiding writing the first data element to the first storage area in response to determining that the first storage area is the write-inhibit area.

Such a battery pack can also produce the same effects as those produced by the above-described battery pack.

A battery pack in still another aspect of the present disclosure includes: a rechargeable battery; a rewritable nonvolatile memory including storage areas, the storage areas including a write-inhibit area, each of the storage areas being assigned a respective unique individual address; a write request receiver configured to receive a write request and data from a charger electrically coupled to the battery pack, the write request including a first address assigned to a first storage area of the storage areas, the data including a first data element; a determiner configured to determine whether the first storage area is the write-inhibit area based on the first address included in the received write request; a write controller configured to write the first data element included in the received data to the first storage area in response to the determiner determining that the first storage area is not the write-inhibit area; and a write inhibitor configured to inhibit the write controller from writing the first data element to the first storage area in response to the determiner determining that the first storage area is the write-inhibit area.

Such a battery pack can also produce the same effects as those produced by the above-described battery pack.

Still further another aspect of the present disclosure is a method for writing data to a battery pack.

The method includes: receiving a write request and data by a battery pack, the write request including a first address, the data including a first data element, the first address being assigned to a first storage area of storage areas in a rewritable nonvolatile memory of the battery pack, the storage areas including a write-inhibit area; determining whether the first storage area is the write-inhibit area based on the first address included in the received write request; writing the first data element included in the received data to the first storage area in response to determining that the first storage area is not the write-inhibit area; and avoiding writing the first data element to the first storage area in response to determining that the first storage area is the write-inhibit area.

This method can produce the same effects as those produced by the above-described battery pack.

BRIEF DESCRIPTION OF THE DRAWINGS

Example embodiments of the present disclosure will be described hereinafter with reference to the accompanying drawings, in which.

DETAILED DESCRIPTION OF THE PREFERRED EMBODIMENTS

1. Embodiment (1-1) Configuration of Battery Pack

Figure 1:
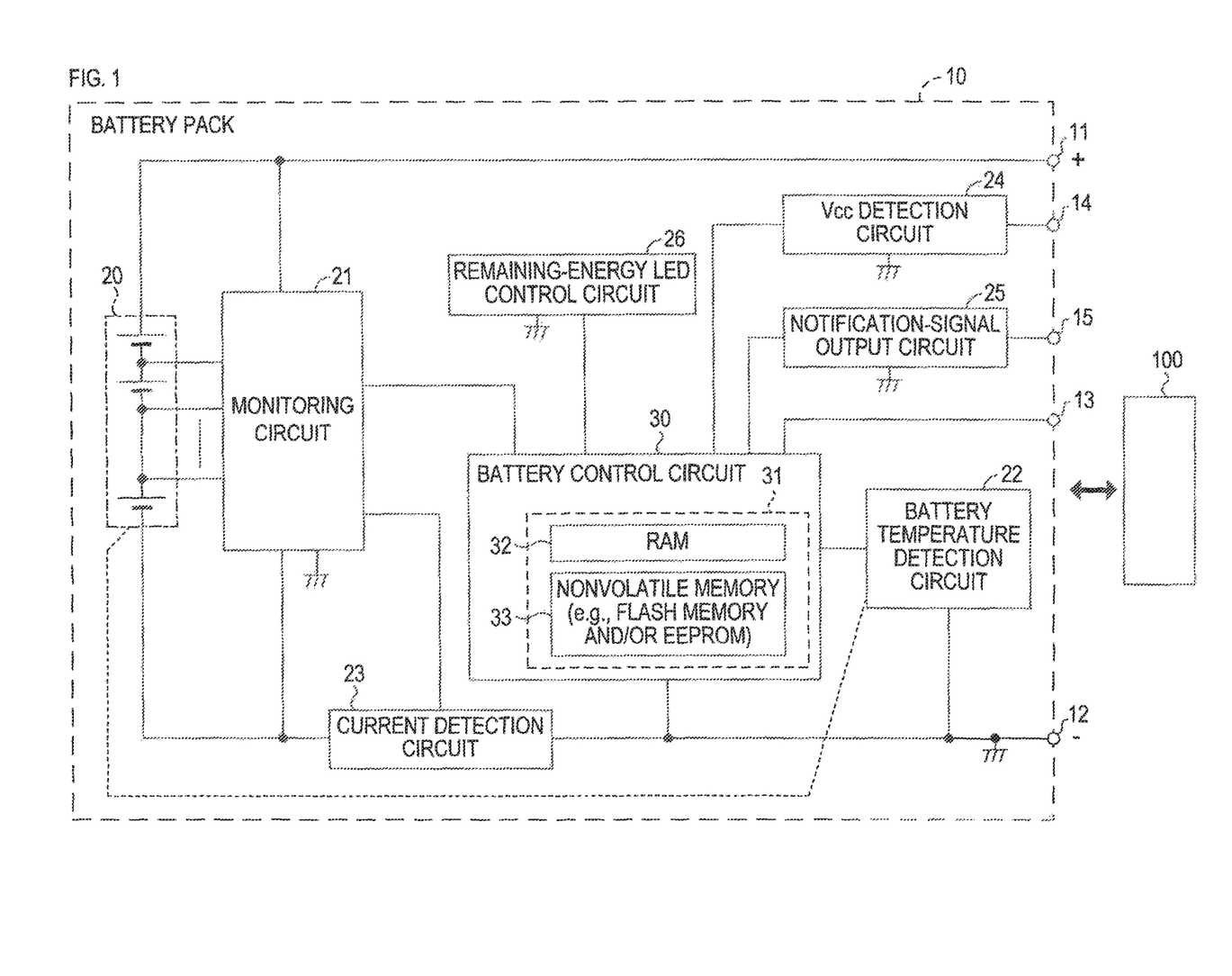
FIG. 1 is a block diagram showing an electric configuration of a battery pack of an embodiment.

A battery pack 10 of the present embodiment shown in FIG. 1 includes a case, which is not shown. The case houses a battery 20 that is rechargeable and dischargeable. This case also houses various circuits, various circuit elements, etc. shown in FIG. 1.

The battery 20 includes cells, each of which is rechargeable and dischargeable. Specifically, the battery 20 includes serially-coupled cell blocks. Each of the cell blocks may include one cell or cells coupled in parallel to one another. The battery 20 may be a lithium-ion battery or a rechargeable battery other than a lithium-ion battery.

The battery pack 10 is configured to be attachable to and detachable from a charger. When the battery pack 10 is attached to the charger, the battery 20 can be charged. Also, the battery pack 10 is configured to be attachable to and detachable from an electric working machine 100. When the battery pack 10 is attached to the electric working machine 100, electric power of the battery 20 can be supplied to the electric working machine 100 to drive the electric working machine 100. Examples of the electric working machine 100 include an electric driver, an electric grinder, an electric hammer, and an electric grass cutter.

The battery pack 10 includes a positive terminal 11 and a negative terminal 12. The positive terminal 11 is coupled to a positive electrode of the battery 20, and the negative terminal 12 is coupled to a negative electrode of the battery 20 via a current detection circuit 23. The battery 20 is charged when electric power is supplied from a charger 40 shown in FIG. 2 to the battery 20 via the positive terminal 11 and the negative terminal 12. The electric power charged to the battery 20 is discharged outside of the battery pack 10 via the positive terminal 11 and the negative terminal 12.

The battery pack 10 includes a communication terminal 13, an input terminal 14, and an output terminal 15. The communication terminal 13, the input terminal 14, and the output terminal 15 can be electrically coupled to devices outside the battery pack 10.

The battery pack 10 communicates data with the charger 40 or the electric working machine that is electrically coupled to the battery pack 10 via the communication terminal 13. The battery pack 10 receives a direct-current (DC) power supply voltage Vcc from the charger 40 electrically coupled to the battery pack 10 via the input terminal 14. A voltage value of the power supply voltage Vcc may be 5 V, for example. The battery pack 10 notifies a maximum charge current value to the charger 40 electrically coupled to the battery pack 10 via the output terminal 15.

The battery pack 10 includes a monitoring circuit 21, a battery temperature detection circuit 22, the current detection circuit 23, a Vcc detection circuit 24, a notification-signal output circuit 25, a remaining-energy LED control circuit 26, and a battery control circuit 30.

The monitoring circuit 21 includes, for example, a single chip integrated circuit (IC). The monitoring circuit 21 acquires a battery voltage value and cell voltage values from the battery 20. The battery voltage value corresponds to a value of a voltage between both ends of the battery 20. Each of the cell voltage values corresponds to a value of a voltage between both ends of corresponding one of the cell blocks. The monitoring circuit 21 monitors the battery 20 based on the acquired battery voltage value, cell voltage values, etc. The monitoring results by the monitoring circuit 21 are outputted to the battery control circuit 30.

The battery temperature detection circuit 22 detects a temperature of the battery 20. The battery temperature detection circuit 22 includes a temperature sensor, such as a thermistor. The temperature sensor is disposed in the vicinity of the battery 20. Specifically, the temperature sensor is secured inside the battery pack 10, for example, such that the temperature sensor is directly in contact with an outer surface of any of the cells. The battery temperature detection circuit 22 detects the temperature of the battery 20 based on a signal inputted from the temperature sensor, and outputs the detection results to the battery control circuit 30.

The current detection circuit 23 is provided in a current path between the negative terminal 12 and the negative electrode of the battery 20. The current detection circuit 23 includes, for example, a resistor disposed in the current path.

Electric current flowing from the negative terminal 12 to the negative electrode of the battery 20 flows through the resistor in the current detection circuit 23. The current detection circuit 23 outputs to the monitoring circuit 21 a signal indicating a value of a voltage between both ends of the resistor, that is, a current detection signal having a voltage value corresponding to a value of the electric current flowing through the resistor.

The monitoring circuit 21 monitors electric current flowing from the battery 20 and electric current flowing to the battery 20 based on the current detection signal inputted from the current detection circuit 23. The monitoring circuit 21 outputs the monitoring results to the battery control circuit 30.

The Vcc detection circuit 24 detects the voltage value of the power supply voltage Vcc inputted to the input terminal 14 from the charger 40. The voltage value of the power supply voltage Vcc detected by the Vcc detection circuit 24 is inputted to the battery control circuit 30. The battery control circuit 30 may determine whether the battery pack 10 is attached to the charger 40 based on whether the voltage value of the power supply voltage Vcc has been detected by the Vcc detection circuit 24.

In accordance with a command from the battery control circuit 30, the notification-signal output circuit 25 generates and outputs a notification signal indicating the maximum charge current value. The maximum charge current value is a maximum value of charge current that can be supplied to the battery 20. The notification signal is an analog signal having a voltage value that corresponds to the maximum charge current value. The notification signal outputted from the notification-signal output circuit 25 is outputted to the charger 40 from the output terminal 15. In the notification-signal output circuit 25, a low pass filter (not shown) is provided to remove noise superimposed on an output path of the notification signal.

The remaining-energy LED control circuit 26 controls lighting-up of a not-shown LED or not-shown LEDs in accordance with a command from the battery control circuit 30, thereby displaying a remaining energy of the electric power that has been charged in the battery 20.

The battery control circuit 30 carries out various controls based on various inputted information, such as monitoring results inputted from the monitoring circuit 21 and detection results inputted from the battery temperature detection circuit 22 and the Vcc detection circuit 24. The various controls to be executed by the battery control circuit 30 includes control of the remaining-energy LED control circuit 26, control of output of the notification signal by the notification-signal output circuit 25, and control of data communication with external devices (e.g., the electric working machine 100 or the charger 40) via the communication terminal 13.

In the present embodiment, the battery control circuit 30 includes a single chip microcomputer (or microprocessor) that includes a not-shown CPU, a storage part 31, etc. As shown in FIG. 1, the storage part 31 includes a RAM 32, and a nonvolatile memory 33, data stored in which is electrically rewritable. The nonvolatile memory 33 may include, for example, a flash memory and/or an EEPROM. The storage part 31 may include other storage devices (e.g., a ROM) than the RAM 32 and the nonvolatile memory 33.

Stored in the storage part 31 are various programs and data to be read and executed by the CPU to achieve various functions of the battery pack 10. The various programs include a program for a battery pack control process in FIG. 3, which will be described later.

The various functions may be implemented in the battery control circuit 30 not only by software. Part or all of the various functions may be implemented in the battery control circuit 30 by a hardware combining a logic circuit, an analog circuit, etc., in place of or in addition to software. More specifically, in order to implement the various functions, the battery control circuit 30 may include in place of or in addition to the microcomputer: a combination of various separate electronic parts; an Application Specified Integrated Circuit (ASIC); an Application Specific Standard Product (ASSP); a programmable logic device, such as a Field Programmable Gate Array (FPGA); or any combination of the aforementioned.

The nonvolatile memory 33 includes storage areas that can store various data. Each of the storage areas is assigned a respective unique individual address. Examples of the data to be stored in the nonvolatile memory 33 include a charge count value, charge history information, deterioration information, a rated voltage value of the battery 20, and previous charge information. The charge count value indicates the number of times of past charging operations. The charge history information indicates various charge histories, excluding the charge count value, such as details of the past charging operations and events that occurred during the charging. The deterioration information indicates a degree of deterioration of the battery 20. The previous charge information indicates whether the previous charging was completed normally. These various pieces of information are stored in storage areas of pre-specified addresses in the storage areas of the nonvolatile memory 33.

Figure 4A:
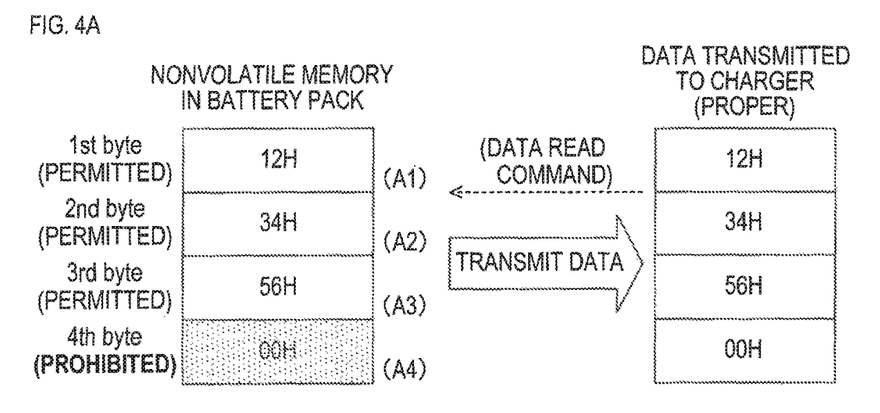
FIG. 4A is an illustrative view showing an example of data to be notified to the charger when a regular specified value is stored in a write-inhibit area of a nonvolatile memory in the battery pack.

For example, as shown in FIG. 4A, each of storage areas of Addresses A1, A2, A3, and A4 stores one byte of data. In the present embodiment, data stored in the storage area of Address A1 is referred to as "first byte of data", data stored in the storage area of Address A2 is referred to as "second byte of data", data stored in the storage area of Address A3 is referred to as "third byte of data", and data stored in the storage area of Address A4 is referred to as "fourth byte of data". The one byte of data stored in each of the storage areas of Addresses A1 to A4 corresponds to one example of a data element of the present disclosure.

Each of the storage areas of Addresses A1 to A3 is a write-permit area to which writing of data is permitted. That is, the battery control circuit 30 can write data to the storage areas of Addresses A1 to A3 as needed, depending on condition of the battery pack 10, communication with the charger 40, etc. The term "write" used herein includes writing new data in a storage area where no data is stored and also includes replacing or overwriting already-written data with other data.

On the other hand, the storage area of Address A4 is designated as a write-inhibit area to which writing of data is prohibited. Accordingly, the battery control circuit 30 does not write data to the storage area of Address A4. In the present embodiment, as explained later, although the charger 40 can request writing of data and designate Address A4, the battery control circuit 30 does not write data in the storage area of Address A4. In other words, the battery control circuit 30 avoids writing of data to the write-inhibit area.

Various kinds of data are stored in the respective storage areas of Addresses A1 to A3. For example, data that has been set, calculated, etc. by the charger 40 and then received from the charger 40 may be stored to the respective storage areas of Addresses A1 to A3. Also, the aforementioned number of times of charging operations, deterioration information, etc. may be stored in the respective areas of Addresses A1 to A3.

The battery pack 10 includes a power supply circuit, which is not shown. The power supply circuit generates a DC power supply voltage based on electric power supplied from the battery 20. The power supply voltage generated by the power supply circuit enables operation of parts inside the battery pack 10, such as the battery control circuit 30 and the monitoring circuit 21.

When the battery voltage value of the battery 20 decreases, and the power supply circuit cannot generate the power supply voltage properly, the battery control circuit 30 cannot operate. Thus, the battery pack 10 of the present embodiment is configured to enable the battery control circuit 30 to additionally operate with the power supply voltage Vcc inputted from the charger 40 via the input terminal 14.

(1-2) Configuration of Charger

Figure 2:
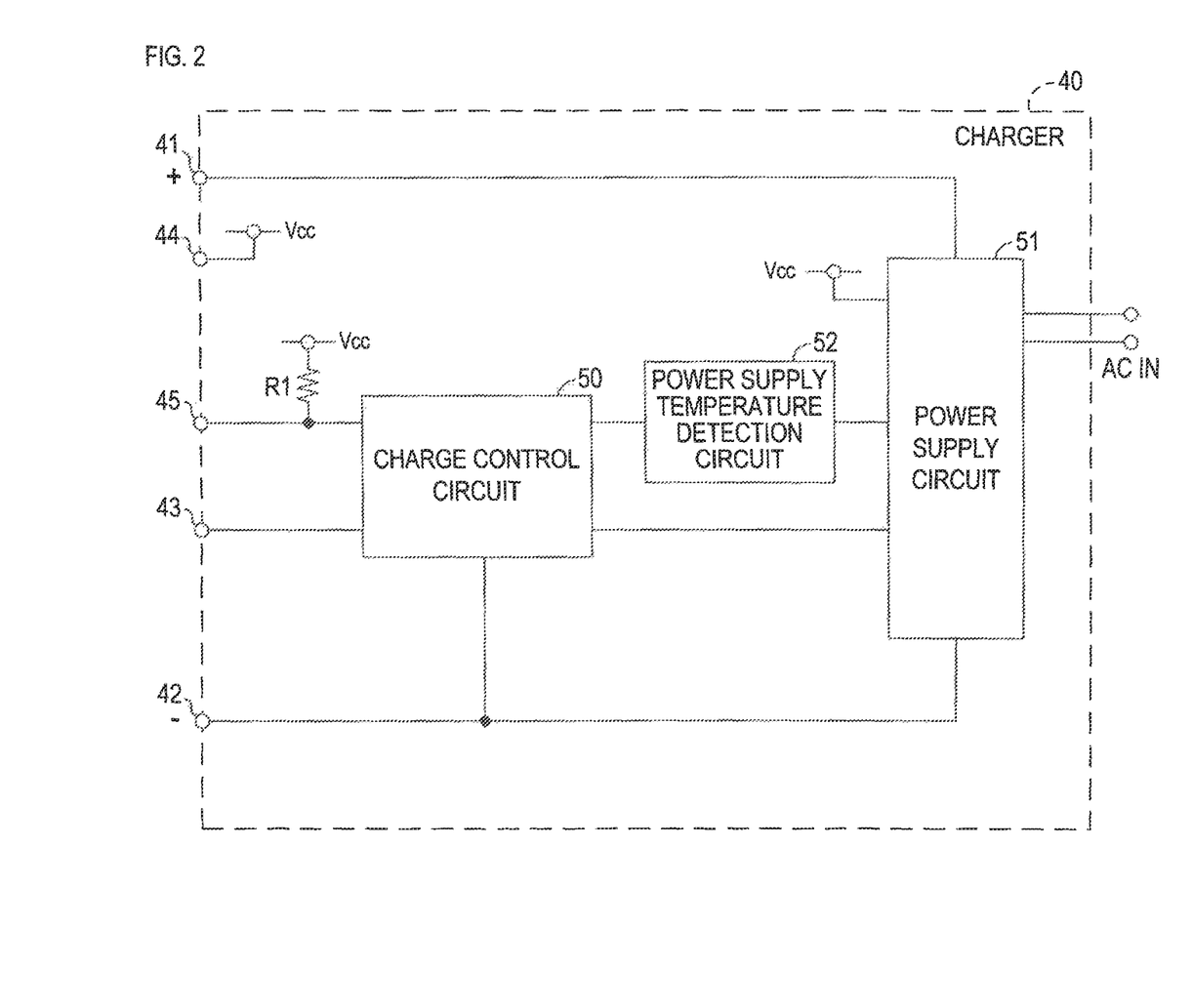
FIG. 2 is a block diagram showing an electric configuration of a charger of the embodiment.

As shown in FIG. 2, the charger 40 is configured to allow the battery pack 10 to be detachably attached to the charger 40. The charger 40 can charge the battery 20 in the battery pack 10 attached to the charger 40.

The charger 40 includes a positive terminal 41, a negative terminal 42, a communication terminal 43, an output terminal 44, and an input terminal 45. The positive terminal 41, the negative terminal 42, the communication terminal 43, the output terminal 44, and the input terminal 45 are electrically coupled to the battery pack 10 attached to the charger 40.

The positive terminal 41 is coupled to the positive terminal 11 of the battery pack 10. The negative terminal 42 is coupled to the negative terminal 12 of the battery pack 10. The communication terminal 43 is coupled to the communication terminal 13 of the battery pack 10. The output terminal 44 is coupled to the input terminal 14 of the battery pack 10. The input terminal 45 is coupled to the output terminal 15 of the battery pack 10.

The charger 40 further includes a charge control circuit 50, a power supply circuit 51, and a power supply temperature detection circuit 52.

As in the case of the battery control circuit 30, the charge control circuit 50 includes a single chip microcomputer (not shown). That is, the charge control circuit 50 includes a CPU, a storage part, etc., which are not shown. The storage part includes various semiconductor memories, such as a RAM, a ROM, and a flash memory.

Stored in the storage part of the charge control circuit 50 are various programs and data to be read and executed by the CPU to achieve various functions of the charger 40. The various programs stored in the storage part of the charge control circuit 50 include a program for a charge control process in FIG. 7, which will be described later.

The various functions may be implemented in the charge control circuit 50 not only by software. Part or all of the various functions may be implemented in the charge control circuit 50 by a hardware combining a logic circuit, an analog circuit, etc., in place of or in addition to software. Moreover, it is merely one example that the charge control circuit 50 includes the single chip microcomputer. The charge control circuit 50 may include various configurations that enable the various functions.

The power supply circuit 51 receives alternating-current (AC) electric power having an AC voltage of 100 V supplied from an external power source, for example, a commercial power source, etc. With the AC electric power, the power supply circuit 51 generates charging power necessary for charging the battery 20. The charging power generated by the power supply circuit 51 is outputted to the battery pack 10 via the positive terminal 41 and the negative terminal 42.

Moreover, with the AC electric power received from the external power source, the power supply circuit 51 generates the DC power supply voltage Vcc having a constant voltage value. In the present embodiment, the voltage value of the power supply voltage Vcc may be 5 V, as described above. The power supply voltage Vcc is supplied to each part inside the charger 40 so as to be used for operating such part. The power supply voltage Vcc is further outputted to the input terminal 14 of the battery pack 10 from the output terminal 44.

The power supply circuit 51 is controlled by the charge control circuit 50. The charge control circuit 50 communicates data with the battery control circuit 30 of the battery pack 10 coupled to the charger 40, via the communication terminal 43. The charge control circuit 50 controls the power supply circuit 51, while communicating data with the battery control circuit 30, thereby controlling charging to the battery 20.

During the charging of the battery 20, the charge control circuit 50 acquires the maximum charge current value, based on the notification signal inputted to the input terminal 45 of the charger 40 from the output terminal 15 of the battery pack 10. The charge control circuit 50 controls the power supply circuit 51 such that a value of the charge current to be supplied to the battery 20 does not exceed the maximum charge current value.

An input path for the notification signal from the input terminal 45 to the charge control circuit 50 is coupled to a power supply line inside the charger 40 via a resistor R1. This power supply line is a current path through which the power supply voltage Vcc is supplied. The power supply voltage Vcc is applied to the power supply line.

For this reason, when the battery pack 10 is not attached to the charger 40, a value of the voltage inputted to the charge control circuit 50 from the input terminal 45 is the voltage value of the power supply voltage Vcc. Consequently, based on this inputted voltage value, the charge control circuit 50 can detect that the battery pack 10 is not coupled to the charger 40.

When the battery pack 10 is attached to the charger 40, the notification signal outputted from the notification-signal output circuit 25 of the battery pack 10 via the output terminal 15 is inputted to the charge control circuit 50 via the input terminal 45 of the charger 40.

A voltage value of the notification signal is equal to or less than a constant-voltage value that is lower than the voltage value of the power supply voltage Vcc.

Assume that the maximum charge current value that can be supplied to the battery 20 can vary, for example, from 0 A to 9 A, in accordance with the condition of the battery 20. In this case, for example, in order to set 0 A to the maximum charge current value, the battery control circuit 30 outputs a notification signal having a voltage value of, for example, 1 V from the notification-signal output circuit 25. Also, for example, in order to set 9 A to the maximum charge current value, the battery control circuit 30 outputs a notification signal having a voltage value of, for example, 3 V from the notification-signal output circuit 25. In other words, the battery control circuit 30 linearly varies the voltage value of the notification signal in a range of 1 V to 3 V, in accordance with the variation of 0 A to 9 A of the maximum charge current value to be set.

The battery control circuit 30 may use a voltage value that is outside the range of the voltage value of the notification signal (e.g., 0 V to 1 V, or 3 V to 5 V), thereby outputting information different from the maximum charge current value from the notification-signal output circuit 25.

The charger 40 includes the power supply temperature detection circuit 52 that detects a temperature of the power supply circuit 51. The detection results by the power supply temperature detection circuit 52 are inputted to the charge control circuit 50. The charge control circuit 50, for example, reduces the charge current to the battery 20 when the temperature detected by the power supply temperature detection circuit 52 is high.

(1-3) Battery Pack Control Process

Figure 3:
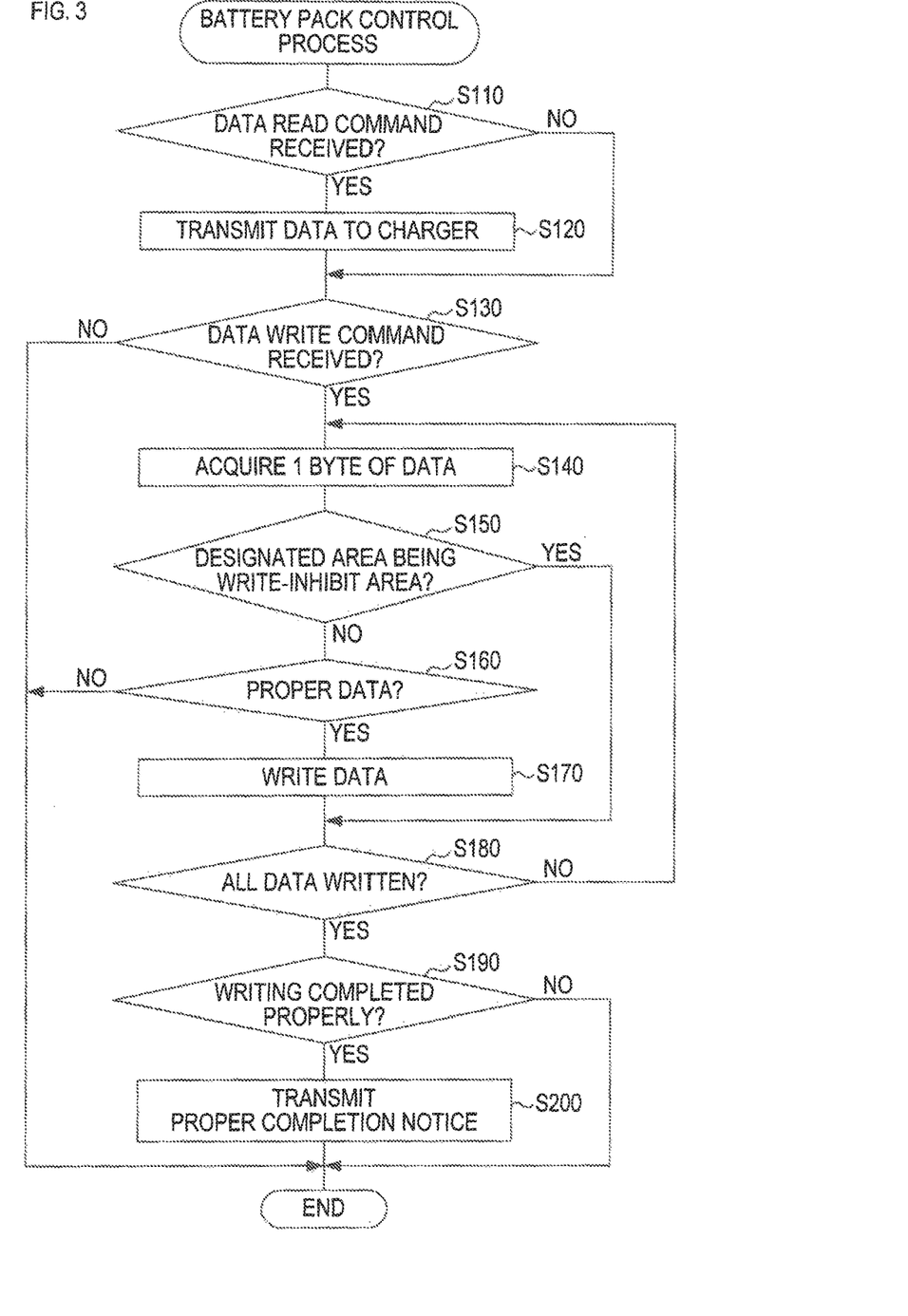
FIG. 3 is a flowchart of a battery pack control process executed in the battery pack.

The battery control circuit 30 periodically executes the battery pack control process shown in FIG. 3 as one of the main routines, while detecting that the battery pack 10 is attached to the charger 40 based on the detection results by the Vcc detection circuit 24. In the present embodiment, the battery pack control process is executed by the CPU in the battery control circuit 30 in accordance with the program for the battery pack control process stored in the storage part 31.

When the battery pack control process is started, the battery control circuit 30 determines in S110 whether a data read command has been received from the charger 40 via the communication terminal 13. The data read command includes a data-reading request and a starting address of a read area in the nonvolatile memory 33.

If it is determined in S110 that the data read command has not been received from the charger 40, then the present process proceeds to S130. On the other hand, if the data read command has been received from the charger 40, the present process proceeds to S120.

In the present embodiment, for example, Address A1 in the nonvolatile memory 33 may be set to the starting address included in the data read command. Upon receipt of the data read command including Address A1, the battery control circuit 30 reads a specified number of bytes of data from the storage area(s) starting with Address A1 in the nonvolatile memory 33. Then in S120, the read data is transmitted to the charger 40 via the communication terminal 13.

When receiving the data read command, the battery control circuit 30 of the present embodiment reads four bytes of data starting from the starting address and transmits the read four bytes of data to the charger 40 in S120.

Accordingly, for example, when the starting address is set as Address A1, the battery control circuit 30 reads four bytes of data starting from Address A1, that is, data stored in the storage areas of Addresses A1 to A4, and transmits the read data to the charger 40. In this case, the read area includes the write-inhibit area of Address A4. The battery control circuit 30 reads data in the read area including the write-inhibit area and transmits the read data to the charger 40.

In the present embodiment, in order to confirm whether the nonvolatile memory 33 functions properly, the charger 40 transmits the data read command (including starting address A1) to the battery control circuit 30, thereby acquiring data stored in the write-inhibit area (A4) in addition to data stored in the write permit areas (A1 to A3).

The data read command may designate, not only the starting address, but also a range of storage areas from which data is read. In the above-described case, the data read command may designate, for example, Addresses A1 to A4 as the aforementioned range. Alternatively, the data read command may designate a starting address and the number of bytes.

Each of the storage areas of Addresses A1 to A4 stores data as shown in FIG. 4A. In FIG. 4A, the battery control circuit 30 operates properly and a specified value (e.g., "00H") is stored in a storage area of the fourth byte referred to as the write-inhibit area, i.e., the storage area of Address A4.

Figure 4B:
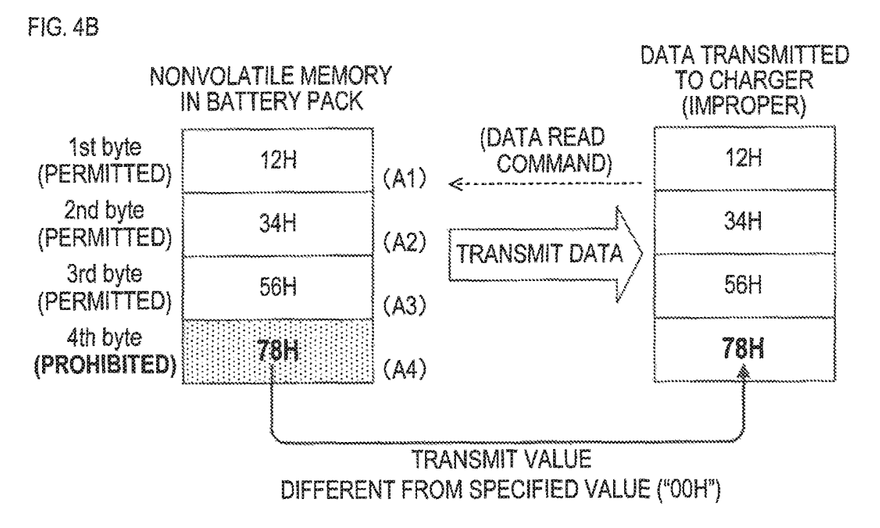
FIG. 4B is an illustrative view showing an example of data to be notified to the charger when data that is different from the regular specified value is stored in the write-inhibit area.

On the other hand, FIG. 4B shows an example in which data (e.g., "78H") different from the specified value is stored in the storage area of Address A4 in which the specified value should be stored. The data in the storage area of Address A4 may change from the specified value when some improper situation occurs. Examples of such improper situation may be a situation in which the nonvolatile memory 33 functions improperly, the battery control circuit 30 operates improperly, etc.

When transmitting the data read from the write-inhibit area to the charger 40 in S120, the battery control circuit 30 transmits the data read from the write-inhibit area to the charger 40 without correcting the data. In other words, when a regular specified value is stored in the write-inhibit area as shown in FIG. 4A, the battery control circuit 30 transmits the specified value to the charger 40. On the other hand, when a value different from the specified value is stored in the write-inhibit area as shown in FIG. 4B, the battery control circuit 30 transmits the value different from the specified value to the charger 40.

In S130, it is determined whether a data write command has been received from the charger 40 via the communication terminal 13. The data write command includes a data write request, a starting address of a write area in the nonvolatile memory 33 (i.e., an area to which data is to be written), and a to-be-written data.

If it is determined in S130 that the data write command has not been received from the charger 40, then the battery pack control process is terminated. On the other hand, if the data write command has been received from the charger 40, then the data is written to the nonvolatile memory 33 based on the received data write command in S140 and the subsequent steps.

In the present embodiment, the charger 40 can transmit at least two kinds of the data write commands; a first kind of data write commands includes the starting address set as Address A1 and three bytes of data, and a second kind of data write command includes the starting address set as Address A4 and one byte of data. As such, in the present embodiment, there are cases in which one unit of data transmitted from the charger 30 is, for example, three bytes of data (in the first kind of data write command), or one byte of data (in the second kind of data write command). In a case where one unit of data transmitted from the charger 30 is three bytes of data, each one byte of data included in the three bytes of data corresponds to an example of a data element of the present disclosure. In a case where one unit of data transmitted from the charger 30 is one byte of data, the one byte of data corresponds to an example of the data element of the present disclosure, as well as an example of data of the present disclosure.

When the received data write command includes the starting address set as Address A1 and three bytes of data, the battery control circuit 30 writes three bytes of data to the respective storage areas in the order starting from the storage area of Address A1 in the nonvolatile memory 33 by the processes of S160 to S180. As a result, the aforementioned three bytes of data are written to the respective storage areas of Addresses A1 to A3 in the nonvolatile memory 33.

On the other hand, when the received data write command includes the starting address set as Address A4 and one byte of data, the battery control circuit 30 disables writing of the one byte of data by determination made in S150, and avoids (or inhibits) writing the data to the storage area of Address A4. In other words, the battery control circuit 30 does not write the data to the storage area of Address A4.

The starting address included the data write command may be any address. The to-be-written data included in the data write command may have any data amount. The data write command may include, for example, the starting address set as Address A1 and four bytes of the to-be-written data. In this case, when the battery control circuit 30 is operating properly, writing of data to the storage area of Address A4 as the write-inhibit area is avoided, even if commanded to write there; consequently, data is written only to the storage areas of Addresses A1 to A3.

The data write command may designate, not only the starting address, but also a range of the write areas. In this case, the data write command may designate, for example, Addresses A1 to A4 as the range of the write areas. The data write command may further designate specifically what data should be written to which address.

Figure 5:
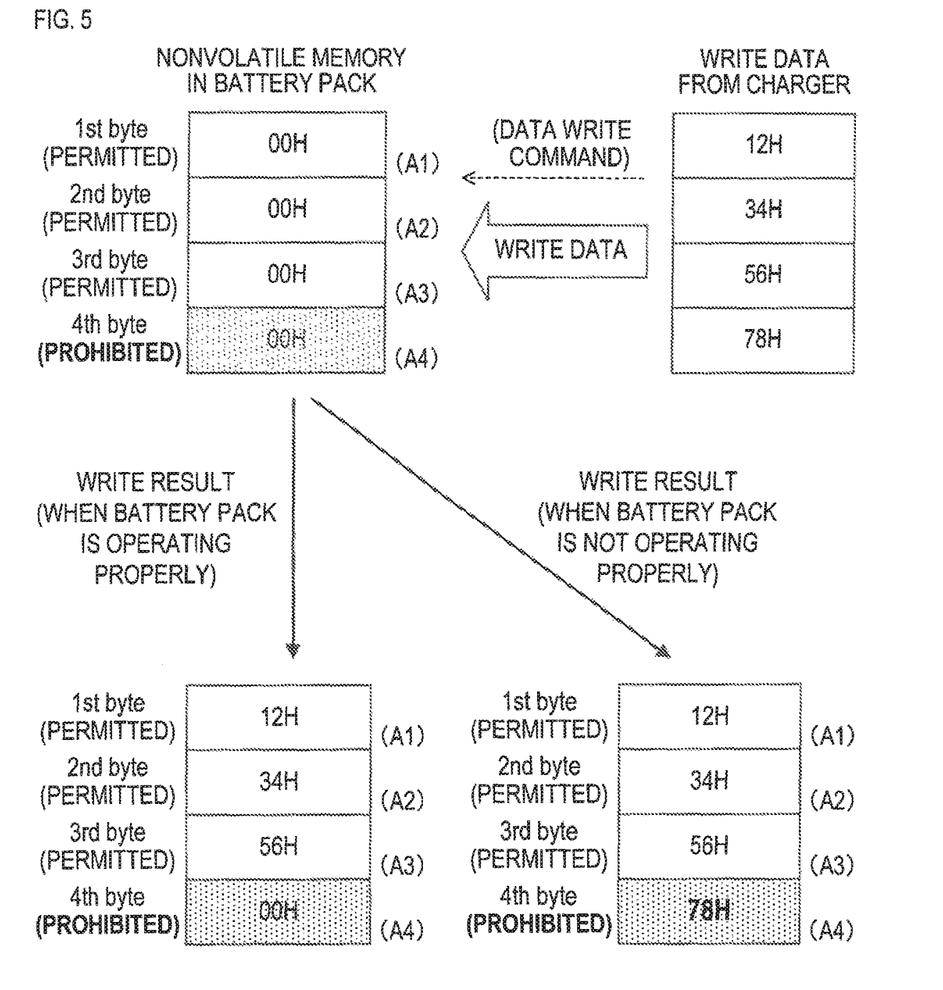
FIG. 5 is an illustrative view schematically showing a write process in response to a data write command to a storage area including the write-inhibit area.

As illustrated in the upper right in FIG. 5, the to-be-written data transmitted from the charger 40 includes data (e.g., "78H") different from the regular specified value for the storage area of Address A4 in the nonvolatile memory 33, i.e., the write-inhibit area. In order to confirm whether the nonvolatile memory 33 is functioning properly, the charger 40 may request the battery control circuit 30 to write the data (different from the specified value) to the storage area of Address A4.

Upon receipt of the data write command from the charger 40, the battery control circuit 30 acquires one byte of data out of the received to-be-written data in S140. Here, for example, the earliest received one byte of data, out of the to-be-written data that has not yet been acquired in S140, is acquired.

For example, in the case that Address A1 is set to the starting address and three bytes of data are received, a first byte of data (e.g., "12H") to be written to the storage area of Address A1 is acquired in S140 executed for the first time immediately after the data write command is received. Also, for example, a third byte of data (e.g., "56H") to be written to the storage area of Address A3 is acquired in S140 executed for the third time after the data write command is received. Moreover, for example, in the case that Address A4 is set to the starting address and one byte of data is received, the received one byte of data is acquired in S140.

In S150, it is determined whether a designated storage area for writing the acquired one byte of data in S140 is the write-inhibit area, for example, based on the address assigned to the designated storage area. When the designated storage area is the write-inhibit area, i.e., for example, the address of the designated storage area is Address A4, the present process proceeds to S180 without writing the acquired data to the designated storage area (i.e., the write-inhibit area).

If it is determined in S150 that the designated storage area is not the write-inhibit area, the present process proceeds to S160. For example, in the case that the battery control circuit 30 receives four bytes of data shown in the upper right in FIG. 5, and one byte of data acquired in S140 is any of the first byte of data, second byte of data, and third byte of data, the present process proceeds to S160.

In S160, it is determined whether the one byte of data acquired in S140 is proper. This determination may be made in any manner. For example, the determination may be made by comparing data transmitted to the charger 40 in S120 with data received from the charger 40 this time. If the data received this time satisfies a specified proper condition, it may be determined that the data received this time is proper. If the data received this time does not satisfy the proper condition, it may be determined that the data received this time is improper. More specifically, for example, assume a case in which the data indicates the charge count value. For example, the data transmitted in S120 indicates the charge count value of "100", but the charge count value acquired in S140 is a value (e.g., "1000") completely different from the expected value of "101". In this case, it may be determined that the transmitted data is not proper. In this example, the condition for determining whether the charge count value is proper is to acquire a charge count value that is acquired by incrementing by one the charge count value transmitted in S120.

In S160, if it is determined that the one byte of data acquired in S140 is not proper, the battery pack control process is terminated. In this case, the battery pack control process is terminated without transmission of a proper completion notice in S200, which will be explained later.

In S160, if it is determined that the acquired one byte of data is proper, the present process proceeds to S170. In S170, the acquired one byte of data is written to a storage area of the corresponding address. For example, when the acquired one byte of data is the second byte of data, the data is written to the storage area of Address A2. After S170, the present process proceeds to S180.

In S180, it is determined whether all of the to-be-written data (excluding data intended for the write inhibit area) included in the data write command received from the charger 40 have been written to the nonvolatile memory 33.

If there is data that has not yet been written, i.e., there is data that has not yet acquired in S140, the present process returns to S140. If it is determined in S180 that all of the received data to be written have been written, the present process proceeds to S190.

For example, assume that the received data write command includes the starting address set as Address A1 and four bytes of data. If the battery control circuit 30 is operating properly when writing of all of the received data is completed, the received first, second, and third bytes of data are written properly to the nonvolatile memory 33 whereas the received fourth byte of data is not written to the nonvolatile memory 33.

Also, assume, for example, the following case: as shown in the upper left in FIG. 5, each of the storage areas of Addresses A1 to A4 in the nonvolatile memory 33 initially stores the data "00H"; the charger 40 designates the storage areas of Addresses A1 to A4 as the write area; and, as shown in the upper right in FIG. 5, the data "12H", "34H", "56H", and "78H", each consisting of one byte, are received in sequence.

In this case, when the battery control circuit 30 is operating properly, the data stored in the respective storage areas of Addresses A1 to A4 is as shown in the lower left in FIG. 5. That is, the data received from the charger 40 is written to each of the storage areas of the first, second, and third byte of data. On the other hand, the received data is not written to the storage area of the fourth byte of data designated as the write-inhibit area (i.e., the storage area of Address A4), and the specified value ("00H" in this example) is maintained in this storage area.

When an improper situation occurs in which the battery control circuit 30 does not operate properly, as shown in the lower right in FIG. 5, the received data may be written to the storage area of the fourth byte of data as the storage area of Address A4 (i.e., the write-inhibit area). Examples in which the battery control circuit 30 does not operate properly include a situation in which the nonvolatile memory 33 does not function properly. The battery control circuit 30 that operates improperly may write data to the write-inhibit area in accordance with the write request to the write-inhibit area.

In S190, it is determined whether writing by the processes in S140 to S180 has been completed properly. This determination is made based on data to be written to a write-permit area. If there is data that has not been written properly to the write-permit area, the battery pack control process is terminated. In this case, the battery pack control process is terminated, without transmission of the proper completion notice in S200, which will be explained later.

In S190, when data is properly written to the write-permit area, the present process proceeds to S200. If the data write command designates the write-inhibit area only and includes only data to be written to the write-inhibit area, an affirmative determination is made in S190; then, the present process proceeds to S200.

In S200, the proper completion notice is transmitted to the charger 40 via the communication terminal 13. The proper completion notice notifies, at least, that data is properly written to the write-permit area in response to the data write command.

The proper completion notice includes the to-be-written data transmitted from the charger 40. In other words, the battery control circuit 30 transmits to the charger 40 all of the to-be-written data received from the charger 40 after proper completion of writing of data.

Figure 6:
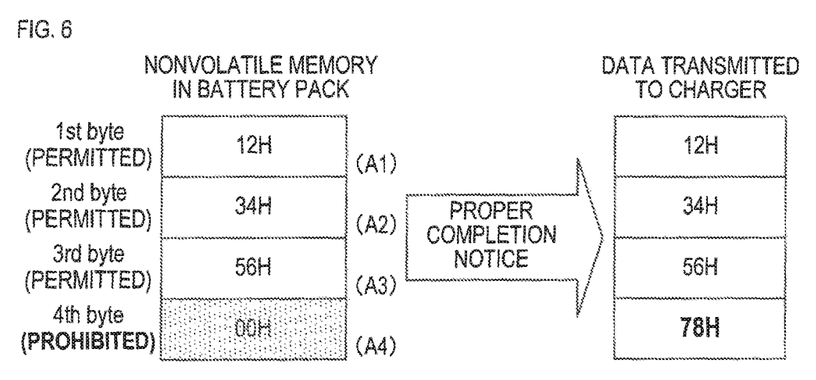
FIG. 6 is an illustrative view showing a specific example of a proper completion notice to be transmitted from the battery pack to the charger.

Assume, for example, that the charger 40 requests the battery control circuit 30 to write four bytes of data, as shown in the upper right in FIG. 5, to the nonvolatile memory 33. Additionally, as a result of proper writing to the battery pack 10, for example, as shown in the left in FIG. 6, the transmitted first, second and third bytes of data are written to the nonvolatile memory 33, and the transmitted fourth byte of data is invalidated. Consequently, the storage area of Address A4 maintains the original specified value. In this case, the battery control circuit 30 does not send back the actually stored data but sends back to the charger 40 four bytes of data of "12H", "34H", "56H", and "78H" received from the charger 40 in sequence as shown in the right in FIG. 6, as the proper completion notice in S200.

(1-4) Charge Control Process

Figure 7:
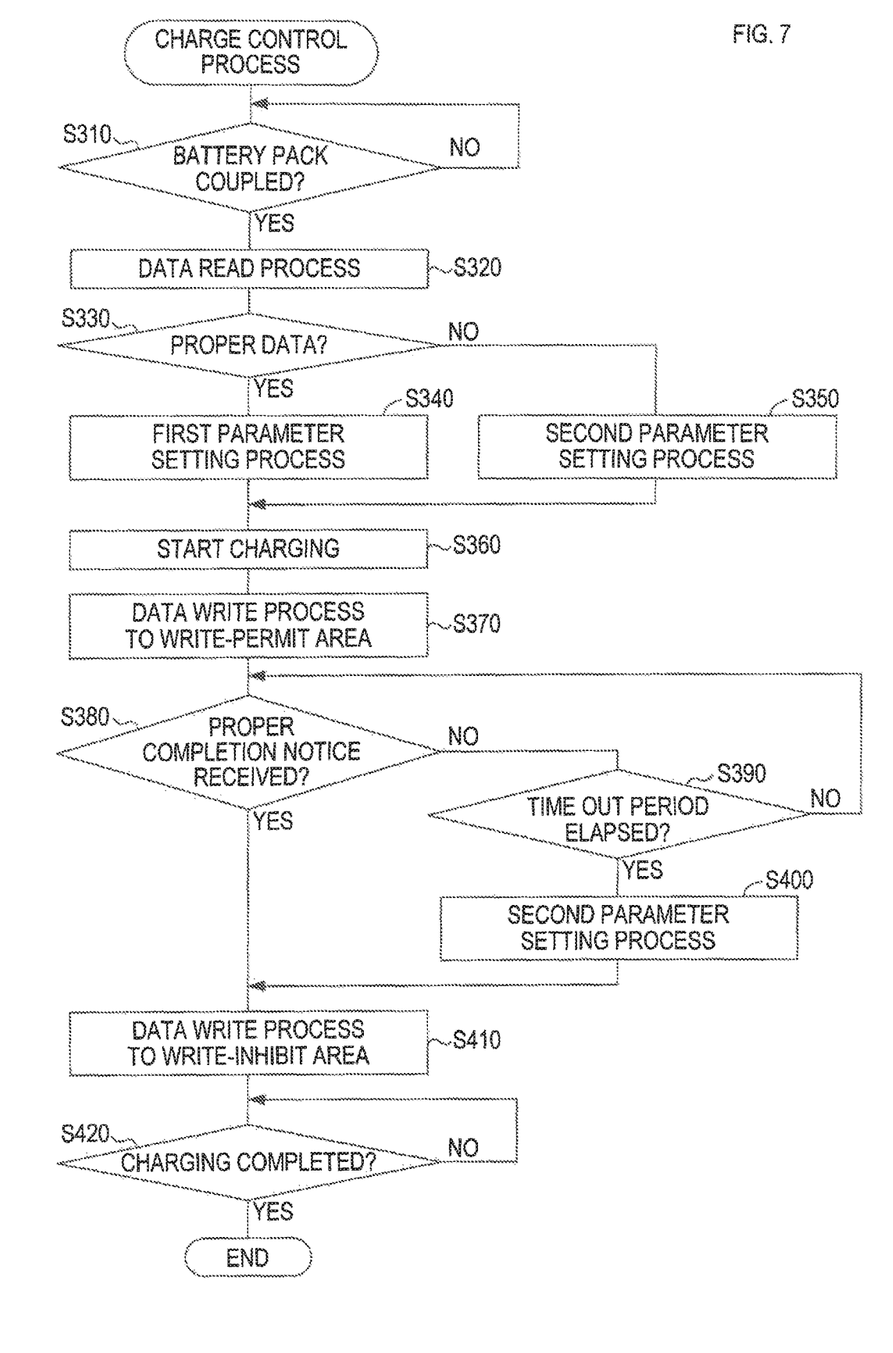
FIG. 7 is a flowchart of a charge control process to be executed in the charger.

The charge control circuit 50, after started, executes the charge control process shown in FIG. 7 as one of the main routines. In the present embodiment, the charge control process is executed by the CPU of the charge control circuit 50 in accordance with the program for the charge control process stored in the storage part of the charge control circuit 50.

When the charge control process is started, the charge control circuit 50 determines in S310 whether the battery pack 10 is coupled to the charger 40. This determination may be made, for example, based on whether the voltage value of the input terminal 45 is below the voltage value of the power supply voltage Vcc. If the voltage value of the input terminal 45 is equal to the voltage value of the power supply voltage Vcc, it may be determined that the input terminal 45 is opened and the battery pack 10 is not coupled to the charger 40.

When the battery pack 10 is not coupled to the charger 40, the determination in S310 is repeated. When the battery pack 10 is coupled to the charger 40, the present process proceeds to S320. In S320, data is read from the nonvolatile memory 33. Specifically, the data read command is transmitted to the battery pack 10 via the communication terminal 43. In response to the data read command, data transmitted from the battery pack 10 is acquired by the charger 40 via the communication terminal 43.

When the charge control circuit 50 transmits the data read command to the battery pack 10, the battery pack 10 reads data from the nonvolatile memory 33 by the process of S120 in FIG. 3 and transmits the read data to the charge control circuit 50. In the present embodiment, as described above, data stored in the storage areas of Addresses A1 to A4 including the write-inhibit area is read and then, the read data is transmitted to the charge control circuit 50.

In S330, it is determined whether the acquired data from the battery pack 10 by the data read process in S320 is proper. Specifically, it is determined whether the data read from the write-inhibit area is the regular specified value. If the read data is the specified value (e.g., "OOH"), it is determined that the read data is proper. However, if the read data is data different from the specified value, it is determined that the read data is improper.

In addition to the data read from the write-inhibit area, it may be determined whether data read from the write permit areas is proper (for example, whether the data is within an expected range).

When it is determined in S330 that the acquired data is proper, the present process proceeds to S340. In S340, a process is carried out to set one or more values corresponding to the battery pack 10 operating properly (hereinafter, referred to as "first set value(s)") to each of various charge parameters. The various charge parameters are used to charge the battery 20 of the battery pack 10. Examples of the various charge parameters include (i) an upper limit value of the charge current, (ii) a value of a charge voltage, and (iii) a full-charge amount which is used to determine that the battery 20 is fully charged so that charging to the battery 20 should be stopped.

In S340, the first set value with which the battery 20 can be properly and sufficiently charged is set to each of the various charge parameters. Moreover, upon setting the various charge parameters, the various data read from the nonvolatile memory 33 in S320 is referred to, and the various charge parameters are set based on the referred various data. After the process in S340, the present process proceeds to S360.

In S330, when it is determined that the acquired data is improper, the present process proceeds to S350. In S350, a process is carried out to set a value corresponding to the battery pack 10 operating improperly (hereinafter, referred to as "second set value(s)") to each of the various charge parameters. Compared with a case where the first set value is used for charging, a charge amount and charging performance of the battery 20 are lower in a case where the second set value is used for charging.

For example, a second set value set for the upper limit value of the charge current is lower than a first set value set for the upper limit value of the charge current (e.g., one half of the first set value). Also, for example, a second set value set for the charge amount is lower than a first set value set for the charge amount (e.g., 30% of the first set value). After the process in S350, the present process proceeds to S360.

In S360, charging of the battery 20 is started using the various charge parameters set in S340 or S350. For example, during the charging, the charge current is controlled so that the value of the charge current does not exceed the upper limit value. Also, for example, the charge amount is monitored, and, when the charge amount reaches the full-charge amount, the charging is stopped.

The charging is carried out even if the second set value is set as the charge parameter. In this case, however, more time is required to complete the charging, compared with a case where the first set value is set as the charge parameter. Furthermore, the charge amount at the time of completion of the charging is less than the full-charge amount in the proper state. In other words, when the data read from the battery pack 10 is improper, the charging performance of the charger 40 is lowered in order to protect the battery pack 10, thereby reducing the charge amount of the battery 20.

When a specified time (e.g., one minute) elapsed from the start of the charging in S360, the data is written to the nonvolatile memory 33 in S370. Specifically, the above-described data write command that requests writing of data to the write-permit area is transmitted to the battery pack 10 via the communication terminal 43. In S370 of the present embodiment, the data write command requests writing of data only to the write-permit area. However, in S370 of other embodiments, the data write command may request writing of data to the write-permit area and the write-inhibit area. In other words, in S370, for example, writing of four bytes of data to the storage areas of Addresses A1 to A4 may be requested.

In S380, it is determined whether the proper completion notice is received from the battery pack 10 via the communication terminal 43. If it is determined that the proper completion notice is received, the present process proceeds to S410. However, if it is determined that the proper completion notice is not received, the present process proceeds to S390.

In S390, it is determined whether a timeout period has elapsed. If it is determined that the timeout period has not elapsed, the present process returns to S380. If it is determined that the timeout period has elapsed, i.e., if the timeout period has elapsed without receiving the proper completion notice after the data write command is transmitted in S370, the present process proceeds to S400.

In S400, as in S350, the second set value is set as the various charge parameters. Thus, when the second set value is set in S400, the charging is carried out based on the second set value thereafter, even if the charging has been carried out based on the first set value until the last time. After the process in S400, the present process proceeds to S410.

In S410, data is written to the nonvolatile memory 33. Specifically, the above-described data write command that requests writing of data to the write-inhibit area is transmitted to the battery pack 10 via the communication terminal 43. In S410 of the present embodiment, the data write command requests writing of data only to the write-inhibit area; however, in S410 of other embodiments, the data write command may request writing of data to the write-inhibit area and the write-permit area.

In the process of writing data in S410, when the battery control circuit 30 is operating properly, writing of data to the write-inhibit area is disabled. On the other hand, when the battery control circuit 30 is operating improperly, data may be written to the write-inhibit area.

In S420, it is determined whether the charging of the battery 20 based on the set various charge parameters is completed. Until the charging is completed, the determination in S420 is repeated. Upon completion of the charging, the charge control process is terminated.

(1-5) Effects of Embodiment

According to the above-described embodiment, the following effects (1a) to (1e) can be produced.

(1a) The battery control circuit 30 basically writes data in accordance with the data write command received from the charger 40; however, if the battery control circuit 30 is operating properly, then the battery control circuit 30 does not write data to the write-inhibit area even though such writing of data is requested. Consequently, improper writing of data to the nonvolatile memory 33 can be inhibited. More specifically, the battery control circuit 30 invalidates the write request to the write-inhibit area and does not write data to the write-inhibit area; therefore, the battery control circuit 30 can maintain the regular specified value stored in the write-inhibit area. Consequently, occurrence of improper situation that may be caused by storing a value other than the specified value in the write-inhibit area can be inhibited.

(1b) The battery control circuit 30 can perform proper writing of data to the nonvolatile memory 33 excluding the write-inhibit area and the proper completion notice can be transmitted to the charger 40, even if the storage area(s) designated by the data write command received from the charger 40 includes the write-inhibit area. Consequently, regardless of whether the storage area(s) designated by the data write command includes the write-inhibit area, the charger 40 can carry out proper charging of the battery 20.

(1c) When receiving the data read command from the charger 40, the battery control circuit 30 reads the to-be-read data stored in the storage area designated by the data read command and transmits the read data to the charger 40. Even if the storage area(s) designated by the data read command includes the write-inhibit area, the battery control circuit 30 reads all data stored in the designated storage area(s) including the data stored in the write-inhibit area and then, transmits the read data to the charger 40.

The charger 40 transmits the data read command designating a storage area(s) including the write-inhibit area, so as to acquire data stored in the write-inhibit area. The charger 40 can determine whether the battery pack 10 operates properly by confirming the acquired data.

(1d) The battery control circuit 30 determines whether data to be written to a storage area(s) other than the write-inhibit area is proper, when the received data write command designates a storage area(s) other than the write-inhibit area. When the data write command includes data that is not proper, the battery control circuit 30 does not write the data, that is not proper, to the nonvolatile memory 33. In other words, in addition to invalidating the write request to the write-inhibit area, the battery control circuit 30 does not write data to a storage area(s) other than the write-inhibit area when the data to be written to a storage area(s) other than the write-inhibit area is not proper. Consequently, it can be further ensured that improper writing of data to the nonvolatile memory 33 is inhibited.

(1e) In the present embodiment, the charger 40 deliberately requests the battery pack 10 to write data to the write-inhibit area. Thereafter, the charger 40 reads the data stored in this write-inhibit area to determine whether the read data is the regular specified value. If the battery pack 10 is operating properly, the battery control circuit 30 invalidates the write request to the write-inhibit area. The data stored in the write-inhibit area is maintained to be the regular specified value. On the other hand, if the battery pack 10 is operating improperly, the battery control circuit 30 may write data to the write-inhibit area in accordance with the write request.

Therefore, the charge control circuit 50 of the charger 40 requests writing of data to the write-inhibit area and reads the data stored in this write-inhibit area, thereby allowing to determine whether the battery pack 10 is operating properly. If the battery pack 10 is operating properly, the charge control circuit 50 carries out regular charging of the battery 20. If the battery pack 10 is not operating properly, the charge control circuit 50 degrades the charging performance of the battery 20 and charges the battery 20 gently. Consequently, the charging is properly carried out, in accordance with whether the battery pack 10 is operating properly. Furthermore, even though it is determined that the battery pack 10 is not operating properly, the charging is carried out gently. Thus, the battery pack 10 can still be used to drive various devices even though it is not operating properly.

The battery control circuit 30 corresponds to one example of a write request receiver, a write controller, a completion-notifying transmitter, a read request receiver, and a read controller in the present disclosure. The charge control circuit 50 of the charger 40 corresponds to one example of a write request transmitter in the present disclosure. The storage part 31 corresponds to one example of a storage circuit in the present disclosure. The charge control circuit 50 and the power supply circuit 51 of the charger 40 correspond to one example of a charging circuit in the present disclosure. The proper completion notice transmitted in S200 of FIG. 3 corresponds to one example of a write-completion notice in the present disclosure.

2. Other Embodiments

Although the embodiment of the present disclosure has been described, the present disclosure is not limited to the above-described embodiment, and can be practiced in variously modified forms.

(2-1) Arrangement of the data in the nonvolatile memory 33 shown in FIG. 4A is merely one example. Each storage area of address may store various data. The write-inhibit area may be a storage area of any address. The write-inhibit area may store any data.

An unused storage area may be set as a write-inhibit area. In this case, the unused storage area may be blank, or may store an initial value, such as "00H" and "FFH". The write-inhibit area may be a storage area to which a fixed value that does not require modifications such as, for example, parameters for the battery pack 10, is written.

An additional one or more write-inhibit areas may be set. A data amount that can be stored in one address may exceed one byte.

(2-2) The nonvolatile memory 33 may be provided in the battery pack 10 separately from the battery control circuit 30.

(2-3) In the charge control process in FIG. 7, the data is read from the nonvolatile memory 33 at the time of executing S320. However, the data may be read at other times. That is, the data may be read from the nonvolatile memory 33 at times different from the time of executing S320 or at other times in addition to the time of executing S320. When the read data is not proper, the charge parameter may be set as the second set value.

Specifically, for example, until it is determined in S420 that the charging is completed after the start of the charging in S360, the data may be read from the nonvolatile memory 33 at least once. When the read data is not proper, the charge parameter may be set as the second set value.

(2-4) In the charge control process in FIG. 7, the process in S410 is to designate the write-inhibit area and write data to the write-inhibit area. This process in S410 may be carried out at a time different from the time of executing S410 or at other times in addition to the time of executing S410. Specifically, this process in S410 may be carried out, for example, before the start of the charging in S360, before the reading of the data in S320, or while waiting for completion of the charging in S420.

(2-5) The processes of S370 to S400 of the charge control process in FIG. 7, specifically, processes for designating the write-permit area and waiting receipt of the proper completion notice after the data is written to the write-permit area, may be carried out at a time different from the time shown in FIG. 7. The above-described processes may be carried out, for example, at least once while waiting for the start of the charging in S360 after coupling of the battery pack 10 is detected in S310, or while waiting for completion of the charging in S420.

(2-6) In each of the above-described embodiments, a plurality of functions achieved by a single element may be achieved by a plurality of elements, or a single function achieved by a single element may be achieved by a plurality of elements. Also, a plurality of functions achieved by a plurality of elements may be achieved by a single element, or a single function achieved by a plurality of elements may be achieved by a single element. Moreover, a part of the configuration in each of the above-described embodiments may be omitted. An element provided in any one of the above-described embodiments may be added to or replaced with the other one embodiment.

(2-7) The present disclosure may be practiced in various modes. Such modes include the above-described battery pack 10, the charger 40, the charging system including the battery pack 10 and the charger 40, a program enabling a computer to function as the battery control circuit 30 of the battery pack 10, program enabling a computer to function as the charge control circuit 50 of the charger 40, a non-transitory tangible recording medium, such as a semiconductor memory in which the aforementioned programs are stored, and methods used in the battery control circuit 30 and the charge control circuit 50.

What is claimed is:

1. A battery pack comprising:
   a rechargeable battery;
   a rewritable nonvolatile memory including storage areas, the storage areas including a write-inhibit area, each of the storage areas being assigned a respective unique individual address;
   a write request receiver configured to receive a write request and data from a charger electrically coupled to the battery pack, the write request including a first address assigned to a first storage area of the storage areas, the data including a first data element; and
   a write controller configured to execute a write process for the received data, the write process including:
   determining whether the first storage area is the write-inhibit area based on the first address included in the received write request;
   writing the first data element included in the received data to the first storage area in response to determining that the first storage area is not the write-inhibit area; and
   avoiding writing the first data element to the first storage area in response to determining that the first storage area is the write-inhibit area.

2. The battery pack according to claim 1, further comprising:
   a completion-notifying transmitter configured to transmit a write-completion notice to the charger in response to completion of the write process.

3. The battery pack according to claim 1,
   wherein the write process further includes:
   determining whether the first data element is proper; and
   avoiding writing the first data element to the first storage area in response to determining that the first data element is not proper.

4. The battery pack according to claim 1,
   wherein the received data further includes a second data element,
   wherein the write process further includes:
   determining whether a second storage area of the storage areas is the write-inhibit area based on a second address assigned to the second storage area;
   writing the second data element to the second storage area in response to determining that the second storage area is not the write-inhibit area; and
   avoiding writing the second data element to the second storage area in response to determining that the second storage area is the write-inhibit area.

5. The battery pack according to claim 4,
   wherein the write process further includes:
   determining whether the second data element is proper; and
   avoiding writing the second data element to the second storage area in response to determining that the second data element is not proper.

6. The battery pack according to claim 4,
   wherein the first storage area corresponds to a storage area to which the received data is first written.

7. The battery pack according to claim 1,
   wherein the received data further includes a second data element,
   wherein the write request further includes a second address assigned to a second storage area of the storage areas,
   wherein the write process further includes:
   writing the first data element and the second data element to the first storage area and the second storage area respectively based on the first address and the second address included in the received write request;
   determining whether the second storage area is the write-inhibit area based on the second address included in the received write request; and
   avoiding writing the second data element to the second storage area in response to determining that the second storage area is the write-inhibit area.

8. The battery pack according to claim 7,
   wherein the write process further includes:
   determining whether the second data element is proper; and
   avoiding writing the second data element to the second storage area in response to determining that the second data element is not proper.

9. The battery pack according to claim 1, further comprising:
   a read request receiver configured to receive a read request transmitted from the charger, the read request including a third address assigned to a third storage area of the storage areas; and
   a read controller configured to read a data element that is stored in the third storage area based on the third address included in the received read request so as to transmit the read data element to the charger.

10. The battery pack according to claim 9,
wherein the third storage area to which the third address is assigned corresponds to the write-inhibit area.

11. The battery pack according to claim 1,
wherein the battery pack is configured to be attachable to and detachable from an electric working machine.

12. The battery pack according to claim 1,
wherein the rewritable nonvolatile memory includes a flash memory and/or an EEPROM.

13. The battery pack according to claim 1, further comprising:
the charger configured to be electrically coupled to the battery pack,
wherein the charger includes:
  a charging circuit configured to charge the battery in the battery pack electrically coupled to the charger; and
  a write request transmitter configured to transmit the write request and the data to the battery pack electrically coupled to the charger.

14. The battery pack according to claim 13,
wherein the write request transmitted from the write request transmitter includes an address assigned to the write-inhibit area.

15. A battery pack comprising:
a processor; and
a memory circuit including a rewritable nonvolatile memory, the rewritable nonvolatile memory including storage areas, the storage areas including a write-inhibit area, each of the storage areas being assigned a respective unique individual address, and the memory circuit including instructions that makes the processor perform at least the following:
  receiving a write request and data from a charger electrically coupled to the battery pack, the write request including a first address assigned to a first storage area of the storage areas, the data including a first data element;
  determining whether the first storage area is the write-inhibit area based on the first address included in the received write request;
  writing the first data element included in the received data to the first storage area in response to determining that the first storage area is not the write-inhibit area; and
  avoiding writing the first data element to the first storage area in response to determining that the first storage area is the write-inhibit area.

16. A method for writing data to a battery pack,
the method comprising:
  receiving a write request and data by a battery pack, the write request including a first address, the data including a first data element, the first address being assigned to a first storage area of storage areas in a rewritable nonvolatile memory of the battery pack, the storage areas including a write-inhibit area;
  determining whether the first storage area is the write-inhibit area based on the first address included in the received write request;
  writing the first data element included in the received data to the first storage area in response to determining that the first storage area is not the write-inhibit area; and
  avoiding writing the first data element to the first storage area in response to determining that the first storage area is the write-inhibit area.

* * * * *